United States Patent [19]

Grudkowski

[11] 4,328,472

[45] May 4, 1982

[54] ACOUSTIC GUIDED WAVE DEVICES

[75] Inventor: Thomas W. Grudkowski, Glastonbury, Conn.

[73] Assignee: United Technologies Corporation, Hartford, Conn.

[21] Appl. No.: 203,821

[22] Filed: Nov. 3, 1980

[51] Int. Cl.³ .................. H03H 9/36; H03H 9/13
[52] U.S. Cl. .................... 333/141; 333/145; 333/147
[58] Field of Search .............. 333/150–155, 333/193–196, 141–147; 330/5.5; 310/313 R, 313 A, 313 B, 313 C, 313 D, 311, 322–333, 340, 365–371; 331/107 A

[56] References Cited

U.S. PATENT DOCUMENTS 3,922,622 11/1975 Boyd et al. .................. 310/333 X
3,955,160 5/1976 Duffy .......................... 333/150
4,077,023 2/1978 Boyd et al. .................. 310/333 X Primary Examiner—Marvin L. Nussbaum
Attorney, Agent, or Firm—M. P. Williams

[57] ABSTRACT

An acoustic guided wave device has a wave guiding volume (20) which may include transducer elements (22–25) and other metal elements (26), sandwiched between two acoustic half spaces (10, 12) having acoustic velocity faster than the effective acoustic velocity of the material within the wave guiding volume.

10 Claims, 3 Drawing Figures

ACOUSTIC GUIDED WAVE DEVICES

DESCRIPTION

1. Technical Field

This invention relates to acoustic waves, and more particularly to a new class of devices employing acoustic guided waves.

2. Background Art

There is a wide variety of acoustic wave devices utilized for various purposes. One of the most common acoustic waves is the surface acoustic wave (SAW) which propagates at the surface of an acoustic medium. Utilization of a piezoelectric medium allows acoustoelectric coupling between electrical waves and circuits, through acoustoelectric transducers, into the acoustic medium. As is known, SAW devices may be employed in the form of simple delay lines, reflector resonators, and multi-tap signal processors in a variety of types and configurations. In general, SAW devices may be used as primary frequency controls, or as strain-dependent parameter transducers for sensing parameters such as temperature, pressure, force and the like. SAW devices find wide utility because of the versatility thereof and because of the ease of making electrical connection to the transducers and taps formed on the surface of the substrate with which the acoustic wave interacts. However, SAW devices will tolerate little interference with the free space above the surface of the substrate. That is, elements and protective coatings must have a thickness of a small fraction of an acoustic wavelength at the acoustic design frequency (dependent upon the periodicity of the acoustoelectric elements as a function of the acoustic velocity of the medium). In general, any material other than a gas, such as damping fluid, dirt or deposits from dirty gases, and the like, will alter the wave characteristics of the surface and cause the SAW device to operate, if at all, in undesirable modes. Similarly, application of passivation or protective layers will simply cause the surface wave to couple into the surface of the protective layer, thus simply pushing the problem farther away from the substrate. Stated simply, anything that does not spoil the wave simply supports the wave at its surface, and then that surface wave can be spoiled by contaminants.

To overcome this problem, non-surface waves can be employed. However, the utility of bulk waves is limited, in the main, to elements utilized for frequency control, and are difficult to implement for the sensing of strain-inducing parameters. Interface waves (sometimes referred to as Stoneley waves) can be made to propagate at the interface between an isotropic plate and an isotropic half space, but only for certain specific combinations of materials and parameters. The choice of materials, and crystallographic orientation thereof, to suit implementation of specific useful devices, while at the same time optimizing the interface wave, becomes a difficult task.

DISCLOSURE OF INVENTION

Objects of the invention include provision of a non-surface, acoustic wave device capable of implementation with a wide variety of materials and combinations thereof, in a wide range of configurations.

According to the present invention, an acoustic guided wave device comprises a wave guiding volume, of a thickness which is at least a significant fraction of a wavelength, disposed between a pair of half spaces of a thickness in excess of a wavelength, the half spaces having acoustic velocity higher than the effective acoustic velocity of the guiding volume. In further accord with the invention, the guiding volume may comprise metallic elements, together with material of one of the half spaces or other material, the metallic elements comprising elements of acoustoelectric transducers, signal processor taps, or resonator reflectors, or the like.

Because the invention operates with negligible acoustic fields at surfaces, the device is basically insensitive to effects at the surface. Therefore, if the materials of the half space are suited to the environment in which the device is to be placed (e.g., resistant to corrosive attack), than the device is suited for use as is. Otherwise, passivation coatings which are compatible with the materials may be used, since they are too remote from the wave to affect it. The invention may be practiced in a variety of forms utilizing various materials, all of which is within the skill of the art in light of the teachings which follow hereinafter. Similarly, other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
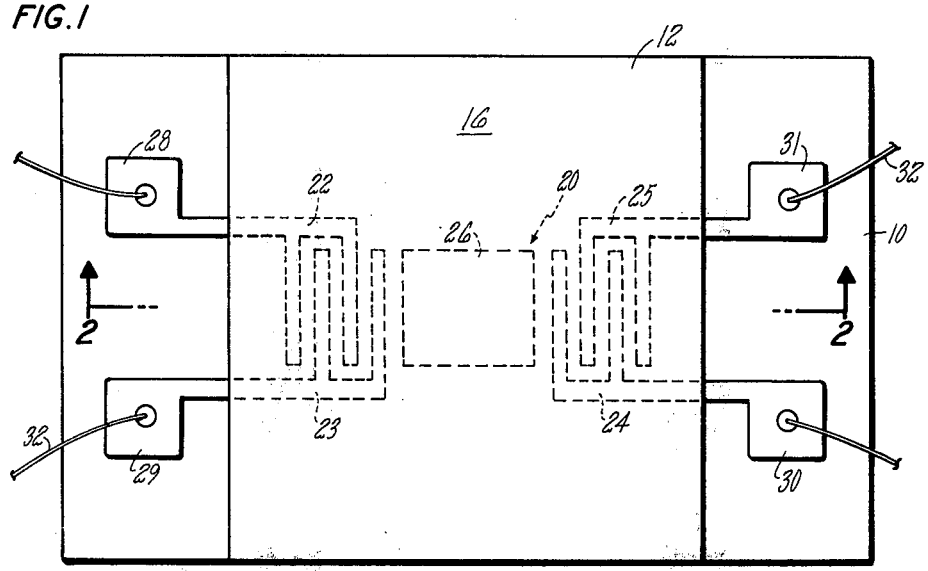
FIG. 1 is a simplified plan view of an acoustic guided wave device in accordance with the invention.
Figure 2:
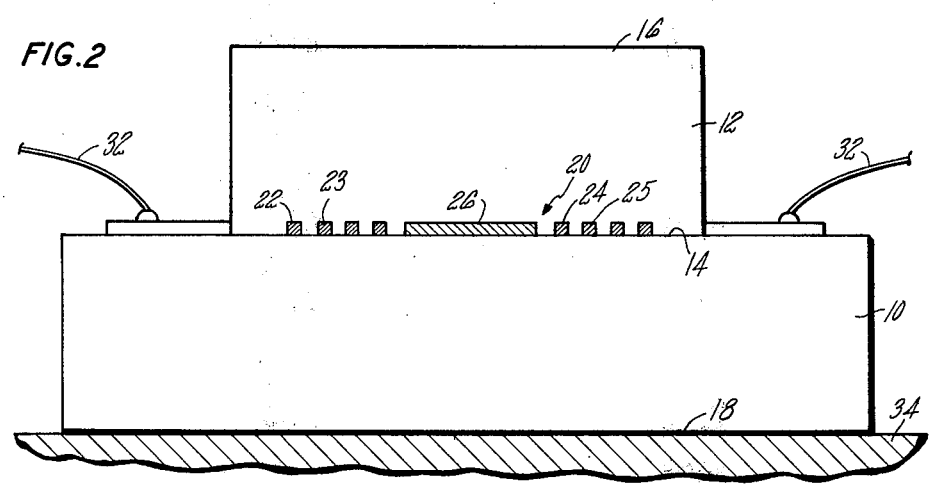
FIG. 2 is a sectioned side elevation taken on the line 2—2 in FIG. 1.
Figure 3:
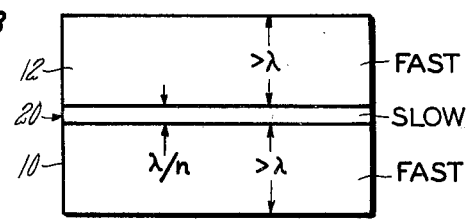
FIG. 3 is a simple diagram illustrating aspects of the invention.

Referring now to FIGS. 1 and 2, a simple exemplary embodiment of the invention may consist of a first half space 10, which may be considered to be a substrate in the usual sense of acoustic devices, and a second half space 12 formed on and essentially contiguous with the first half space 10. By half space, it is meant an acoustic material having sufficient thickness, at least more than the design acoustic wavelength of the device, so that the half spaces 10, 12 appear to be essentially unbounded. In other words, when the half spaces 10, 12 are sufficiently thick, the effects near their junction 14 are relatively insensitive to any conditions on the far surfaces 16, 18 of the half spaces. Between the half spaces 10, 12 there is a wave guiding volume 20, which in the embodiment of FIGS. 1 and 2 comprises the metallic elements 22–25 of interdigital acoustoelectric transducers and an additional metallic element 26 which, in a general case, simply forms part of the guiding volume. The guiding volume 20 also comprises, in the embodiment herein, material of the second half space 12 which is laid down between the metallic elements 22–26. The elements 22–25 may be metallically connected to corresponding bonding pads 28–30 to allow the bonding of connecting wires 32 to the device. As shown, the half space 10 is larger than the half space 12 to provide an accessible surface for the bonding pads 28–31. However, electrical connection to metallic elements for acoustoelectric launching and receiving, as well as for taps in signal processing devices, may be made in any suitable fashion.

Referring to FIG. 2, the principles of the invention, as presently understood, are illustrated in a simplified form. Although the phenomenon of the present invention is not now fully understood, it is believed that the utilization of a guiding volume 20, the thickness of which is some appreciable or significant fraction of a wavelength ($\lambda/n$, where n=1-9) confined between two half spaces 10, 12 (where the thickness between the surface of each half space adjacent to the guiding volume and a free surface is at least greater than the wavelength, and may be several wavelengths, so as to appear to the guiding volume 20 to be unbounded), a wave will be confined substantially within the guiding volume and a small fraction of a wavelength of the thickness of the adjacent half spaces, provided that the guiding volume has an acoustic velocity which is slow relative to the acoustic velocity of the adjacent half spaces.

Although the half spaces could both be of the same material, the material selected for each half space will usually depend upon other functions to be performed by that material. For instance, in FIG. 2 there is illustrated a metallic base 34 (not shown in FIG. 1) to which such a device may ultimately be fastened. In such a case, the half space or substrate 10 may most desirably comprise an electrical insulator, such as silicon dioxide, so as not to present an apparent short circuit plane to the interface 14. On the other hand, in order to have acoustoelectric coupling between the elements 22-25 and the acoustic material of the device, it is necessary that either one of the half spaces 10, 12, or a film adjacent to the elements 22-25, be piezoelectric to provide the acoustoelectric coupling which is required. Thus, the half space 12 may in some cases be selected as zinc oxide. Furthermore, where the device is to be utilized in a high temperature environment (in excess of 1000° F.) the half space or substrate 10 may comprise aluminum oxide and the half space 12 may comprise aluminum nitride. Additional specific examples of materials which may be combined to provide a wave guiding volume disposed between two half spaces in accordance with the present invention are: silicon dioxide between aluminum nitride and silicon; gold between zinc oxide and gallium arsenide; and gold between zinc oxide and lithium niobate. The selection of materials may be achieved by selection of materials which are suitable for the device as a whole, and which provide the acoustic velocity of the wave guiding volume which is slower than that of the half spaces. In general, the determination of wave velocities, to permit selecting materials which have the relative velocities described herein, can be made by considering that the velocity, V, is determined by $V=(C/\rho)^{\frac{1}{2}}$, where C=the stiffness constant of the material for the particular crystallographic orientation used, and $\rho$ is the mass density of the material. The values of C and $\rho$ for various orientations of a large number of materials may be determined from tables set forth in Air Force Cambridge Research Laboratories, Physical Sciences Research Papers, No. 414, entitled "Microwave Acoustics Handbook, Vol. 1, Surface Wave Velocities". And, such values for a number of materials, as well as the basic parameters for calculating values of various materials, are set forth in Auld, B. A., *Acoustic Fields and Waves in Solids,* Vol. 1 and 2, John Wiley and Sons, 1973.

In any of these cases, the metallic elements 22-26 (and similar metallic elements, be they elements of transducers, taps or simply of the guiding volume) may comprise metals such as gold, tungsten, silver or platinum. And, where found necessary or desirable, other metals may be used as an adherent interface, such as a few hundred Angstroms of titanium being deposited on a silicon dioxide half space 10 before depositing gold elements 22-26 thereon, the titanium being deposited in the same pattern (FIG. 1) as the gold. In the generalized embodiment illustrated in FIGS. 1 and 2, the guiding volume 20 consists of transducers elements 22-25 and a general element 26. However, for a simple delay line, the entire volume may be taken up with the elements of two acoustoelectric multi-fingered transducers, the delay of the device being determined by the distance between the centers of the transducers. In this embodiment, it is assumed that the elements 22-25 are one-quarter wavelength long (in the propagation direction, right to left in FIGS. 1 and 2) and separated by one-quarter wavelength. Therefore, for a wave guiding volume 20 on the order of a quarter of a wavelength thick, the elements may be square as illustrated in FIG. 2. On the other hand, the thickness dimension is not now believed to be critical, and elements on the order of 10% or 20% of a wavelength up to a half wavelength or more may be found useful in various implementations of the present invention.

In the embodiments of FIGS. 1 and 2, the wave guiding volume 20 is not homogeneous, in the sense that it includes both metallic elements and material of the second half space 12. While this may appear at first to present a problem, it does not. And, although this is not fully understood, it is believed that the mode support of the guiding volume is dependent upon the average or effective wave velocity in contrast with the wave velocities of the adjacent half spaces 10, 12, and not requiring specific surface interfaces for the phenomenon to be practically operable.

It should be understood that the embodiment illustrated in FIGS. 1 and 2 is shown in a greatly distorted fashion. Normally, the length of the device (right to left in the figures) will be very much longer than the width of the device. However, such configurations are well within the art as developed for surface acoustic waves and device design may incorporate many of the teachings therefrom. In other embodiments, the portion of the wave volume indicated by the element 26 may contain taps for utilization of the device as a universal transversal filter, or tapped delay line or the like, or the entire wave volume may be taken up with one or two transducers along with a plurality of resonator reflector elements. Further, the piezeoelectric material (such as a film) and/or the transducer elements may be disposed outside of the wave guiding volume, which may then be non-piezoelectric and may be sandwiched between non-piezoelectric half spaces. In that sense, the configurations and purposes to which the invention can be put are in most instances directly analogous to corresponding devices and purposes employing surface acoustic waves.

If desired, the wave guiding volume may consist of metallic elements overlaid with a thin film (a small fraction of a wavelength, such as less than 15% thereof) of a relatively slow, nonconducting material such as quartz, bismuth germanium oxide and the like. This may improve the characteristics of the device for utilization in certain applications. Or, the guiding volume 20 may comprise such a nonconducting layer with the metallic elements formed thereon.

When choosing materials and configurations for application of the present invention, the usual care, exercised generally in acoustic devices known in the art, must be taken to provide the materials with suitable crystallographic structure and orientation for the particular device which is being implemented. For instance, if a second half space 12 of aluminum nitride is desired, it may be difficult to grow highly oriented aluminum nitride films on an amorphous substrate (first half space 10) such as thermally grown aluminum oxide. Therefore, it may be desirable to first grow the aluminum nitride film on a sacrificial carrier, followed by deposition of metallic elements thereon, followed by formulation of an amorphous aluminum oxide thick film. And, it is irrelevant as to which of the half spaces has the metallic elements and bonding pads mounted thereon, so long as considerations of electrical isolation, piezoelectric launching, and fabrication compatibility are honored.

An example of a specific device in accordance with the invention employed a ten micron amorphous, thermally oxidized silicon substrate 10, with a one micron thick titanium/gold/titanium interdigital transducer pattern formed on the substrate 10, and a seventeen micron thick zinc oxide layer sputtered over the transducer pattern and the silicon substrate 10. A continuous wave two-port insertion loss of about 34 dB, centered, was observed when operating at the third harmonic of the transducer, 205 MHz. For this case, the acoustic wavelength is about eight microns; thus the half space 10 is slightly more than a wavelength and the half space 12 is nearly two wavelengths in thickness. Even with these not-excessively-thick half spaces 10, 12 the application of fluid to the surface 16 resulted in only a 2 dB increase in two-port insertion loss. This demonstrates the ease with which a device of the present invention can be fabricated to be relatively insensitive to surface effects in general. A particularly useful application of the present device is in a fluid damped, cantilevered acoustic guided wave accelerometer, of a configuration adapted from that disclosed and claimed in a commonly owned copending U.S. patent application entitled FLUID DAMPED SAW ACCELEROMETER, Ser. No. 203,823, filed on even date herewith by Gilden et al. In that case, the surface acoustic wave device of the cantilevered mass is protected by structure from the damping fluid of the accelerometer; this is to avoid wave damping at the surface of the SAW device. However, utilization of a cantilever comprised of a pair of half spaces with the wave guiding volume and transducers as disclosed herein will render the device insensitive to fluid at the remote surfaces of the half spaces. Other utilizations of the invention may include caustic or otherwise hostile environments, where contamination of the surface could dampen or vary the wave characteristics, either in a steady degradation with time or in a manner which varies with time according to the variation of the surface environment characteristic with time.

The invention will, in most cases, be utilized with a wave guiding volume which is less than an acoustic wavelength in thickness. For instance, it is believed that minimum insertion loss and maximum sensitivity may be achieved with thicknesses on the order of a half wavelength. However, it may be that advantageous use of wave guiding volumes more than an acoustic wavelength thick can be made in some cases. This is all within the invention.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

I claim:

1. An acoustic wave device including piezoelectric material and electrically conductive transducer elements disposed in proximity therewith to provide acoustoelectric coupling with said device, characterized by an acoustic wave guiding volume having a thickness which is at least a significant fraction of a wavelength of an acoustic wave in said device, said wave guiding volume being disposed between two acoustic wave half spaces, each of said half spaces comprising material having an acoustic velocity which is faster than the effective acoustic velocity of the material within said wave guiding volume, said piezoelectric material and transducer elements disposed to provide acoustoelectric coupling with said wave guiding volume.

2. An acoustic wave device according to claim 1 further characterized by said transducer elements and said piezoelectric material being disposed within said wave guiding volume.

3. An acoustic wave device according to claim 2 further characterized by one of said acoustic wave half spaces comprising piezoelectric material, said wave guiding volume comprising said transducer elements and material of said one half space.

4. An acoustic wave device according to claim 1 further characterized by said wave guiding volume including at least one electrically conductive element other than said transducer elements.

5. An acoustic wave device according to claim 1 further characterized by said wave guiding volume including metal.

6. An acoustic wave device according to claim 1 further characterized by said wave guiding volume including metal selected from the group consisting of gold, silver, platinum and tungsten.

7. An acoustic wave device according to claim 1 further characterized by one of said acoustic wave half spaces comprising an electrically insulating material.

8. An acoustic wave device according to claim 1 further characterized by one of said acoustic wave half spaces comprising a piezoelectric material.

9. An acoustic wave device according to claim 1 further characterized by said acoustic wave half spaces including material selected from the group consisting of silicon dioxide, zinc oxide, aluminum nitride, aluminum oxide, lithium niobate, gallium arsenide, and silicon.

10. An acoustic wave device according to claim 1 further characterized by said wave guiding volume having a thickness which is less than one acoustic wavelength.

* * * * *